United States Patent
Hsieh et al.

(10) Patent No.: US 6,683,352 B2
(45) Date of Patent: Jan. 27, 2004

(54) SEMICONDUCTOR DEVICE STRUCTURE

(75) Inventors: Tsung-Hsuan Hsieh, Tainan Hsien (TW); Yao-Wen Chang, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/078,314

(22) Filed: Feb. 15, 2002

(65) Prior Publication Data
US 2003/0132486 A1 Jul. 17, 2003

(30) Foreign Application Priority Data
Jan. 17, 2002 (TW) .................................. 91100640 A

(51) Int. Cl.⁷ .............................................. H01L 29/76
(52) U.S. Cl. .................... 257/377; 257/344; 257/369; 257/368; 257/370; 257/372; 257/378; 257/342
(58) Field of Search .................... 257/377, 401, 257/24, 25, 192, 194, 329, 142, 144, 334, 337, 368, 370, 372, 378, 341, 342

(56) References Cited

U.S. PATENT DOCUMENTS

| | | | | |
|---|---|---|---|---|
| 4,947,226 A | * | 8/1990 | Huang et al. ............. | 357/38 |
| 5,192,705 A | * | 3/1993 | Itoh ......................... | 437/57 |
| 5,285,081 A | * | 2/1994 | Ando ....................... | 257/24 |
| 5,304,832 A | * | 4/1994 | Takahashi ................ | 257/342 |
| 5,734,448 A | * | 3/1998 | Cheng ..................... | 349/38 |
| 5,869,374 A | * | 2/1999 | Wu .......................... | 438/291 |
| 5,986,313 A | * | 11/1999 | Ueda et al. ............... | 257/401 |
| 6,127,712 A | * | 10/2000 | Wu .......................... | 257/410 |
| 6,281,546 B1 | * | 8/2001 | Ozeki et al. .............. | 257/329 |
| 6,420,757 B1 | * | 7/2002 | Metzler .................... | 257/341 |

* cited by examiner

Primary Examiner—Nathan J. Flynn
Assistant Examiner—Fazli Erdem
(74) Attorney, Agent, or Firm—J.C. Patents

(57) ABSTRACT

A metal oxide semiconductor field effect transistor structure is disclosed. A p-shape gate, disposed over a semiconductor substrate. A gate dielectric layer is disposed in between the p-shape gate and the semiconductor substrate. A drain region is disposed within the semiconductor substrate, wherein the drain region is surrounded by the p-shape gate. A source region is disposed within the semiconductor substrate, wherein the source region surrounds the p-shape gate. A silicide structure is disposed on the source/drain regions and the p-shape gate.

19 Claims, 2 Drawing Sheets

SEMICONDUCTOR DEVICE STRUCTURE

CROSS-REFERENCE TO RELATED APPLICATION

This application claims the priority benefit of Taiwan application serial no. 91100640,filed Jan. 17, 2002.

BACKGROUND OF THE INVENTION

1. Filed of Invention

The present invention relates to semiconductor device. More particularly, the present invention relates to a metal oxide semiconductor field effect transistor (MOSFET) structure with reduced junction capacitance.

2. Description of Related Art

During a MOSFET device operation, the parasitic junction capacitance of a source/drain region is created at two sides of the depletion region between the source/drain region and the substrate. The junction capacitance is approximately proportional to the area of the source/drain region. Since the junction capacitance has to be charged and discharged each time the transistor switches between the logic states, therefore an increase in junction capacitance will unfavorably slow down the performance of the transistor, because an increased junction capacitance requires longer charging and discharging time.

FIG. 1 depicts a schematic top view of a conventional MOSFET device 18, showing a straight gate electrode 11, symmetric source/drain regions 12 and 13 formed in an active area 17. A plurality of contacts 14 and 15 can be formed above the source/drain regions 12 and 13, respectively.

Still referring to FIG. 1, a dash line 16 shown in the gate electrode 11 represents the width of a channel under the gate electrode 11, while a distance between the source/drain regions 12 and 13 represent the channel length (not indicated). In this case, the channel width determines the flux of the channel current generated between the source/drain regions 12 and 13. The flux is directly proportional to the channel current. In other words, when the channel width becomes smaller as the device is miniaturized, the channel current between the source/drain regions 12 and 13 decreases corresponding to the decrease in the channel width, slowing down performance of the device. Accordingly, it is highly desirable to provide a MOSFET structure having reduced size and while maintaining good device characteristics.

SUMMARY OF THE INVENTION

Accordingly, it is an object of the present invention to provide a semiconductor device structure having a smaller source/drain region, this would reduce the device junction capacitance, therefore, the performance of the device can be improved, which device satisfies the device miniaturization design rule.

It is another object of the present invention to provide a semiconductor device structure having a larger channel width, this would increase the channel current, thus the operation speed of device can be substantially improved.

Yet it is another object of the present invention to provide a semiconductor device having a gate structure, wherein the physical gate dimension is unaltered, and yet satisfies the device miniaturization design rule so that the integration of the device can be increased.

It is another object of the present invention to provide a method for forming a semiconductor device in accord with the above objects of the present invention, which method is also readily viable.

It is an object of the present invention to provide a method for forming a semiconductor device in accord with the above objects of the present invention, which method is also economical.

In accord with the above objects and other advantages of the present invention, a new MOSFET structure comprising a P-shape gate, smaller source/drain regions and a longer channel width is provided.

Specifically, the present invention provides a MOSFET structure comprising a P-shape gate, disposed over a semiconductor substrate. A drain region is disposed within the semiconductor substrate, wherein the drain region is surrounded by the P-shape gate. A source region is disposed within the semiconductor substrate, wherein the source region surrounds the P-shape gate. Silicide structures are disposed on the source/drain regions.

In accord to an aspect of the present invention there is provided a MOSFET device having a P-shape gate structure. Because of the P-shape gate structure, there is a source region surrounding a shrunken drain region therefore, asymmetric source/drain regions with smaller areas can be formed. This makes it possible to further reduce the junction capacitance. And the size of the MOSFET device can be reduced, thereby increasing the integration of the IC device.

In accord to another aspect of the present invention is that because of the smaller source/drain regions, less contacts are required compared to a conventional MOSFET. Consequently, the area needed for a conductive layer to electrically connect with the contacts over the MOSFET can be smaller compared to the conventional MOSFET structure. Thus the integration of the IC device can be increased.

Yet in accord to an aspect of the present invention is that because of the P-shape gate, the channel width can be effectively increased. Because the channel width is increased, the channel current can be larger. Thus the operation speed of the MOSFET device can be substantially increased.

It is understood that the foregoing general description and the following detailed description are exemplary, but are not restrictive, of the present invention.

BRIEF DESCRIPTION OF THE DRAWING

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
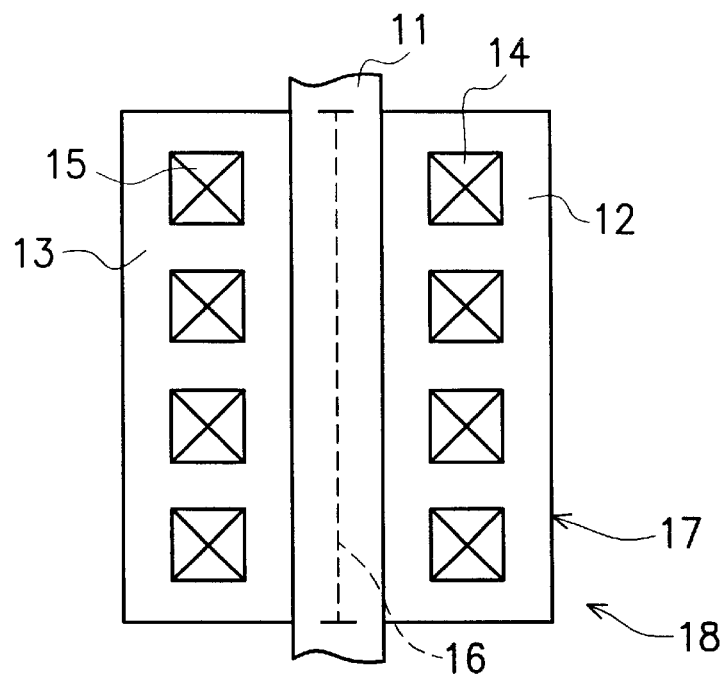
FIG. 1 shows a schematic top view structure of a conventional MOSFET.
Figure 2:
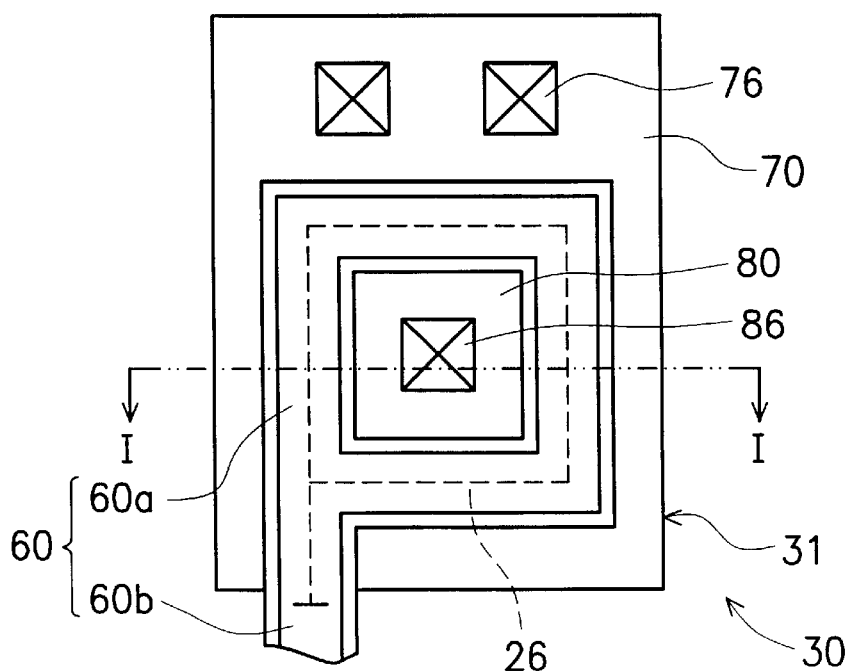
FIG. 2 shows a schematic top view structure of a MOSFET according to a preferred embodiment of the present invention.

FIG. 2 shows a top view of a MOSFET structure 30 according to a preferred embodiment of the present invention. The MOSFET structure 30 comprises an active region 31, the active region having a P-shape gate 60, disposed over a semiconductor substrate (not shown). The P-shape gate 60 comprises a head portion 60a and a tail portion 60b, wherein the head portion 60a has a shape of a hollow square. However the head portion 60a may also include, but not restricted to, a hollow structure in a shape of a rectangle, a circle, a hexagon, an octagon, and the like (not shown in the FIGS.). For example, the P-shape gate may be fabricated using conventional fabrication techniques comprising thermally growing a pad oxide layer over the active device region 31 of a P-type substrate to a thickness of between about 50–300 angstroms. A channel threshold adjust implantation is then performed in the typical manner using, for example, boron or boron fluoride ions for NMOS devices or, for example, arsenic or phosphorous ions for PMOS devices to a dose of between about $3 \times 10^{11}$ ions/cm$^2$ to about $5 \times 10^{13}$ ions/cm$^2$ at an energy of between about 5 to 50 KeV. Next, a conductive layer is deposited over the pad oxide layer. In a preferred embodiment, a polysilicon layer is deposited using a chemical vapor deposition (CVD) method, and the polysilicon layer is doped in situ by using appropriate gas species during the deposition process, or alternatively, any other deposition techniques well known to persons skilled in the art may be used. The total thickness of the layers is preferably about 3000–5000 angstroms, but this may be readily varied to form gate structures of different thickness. Next, a conventional photolithography and etching process is carried out to form a P-shape gate structure 60, as illustrated in FIG. 2.

Still referring to FIG. 2, a source region 70 is disposed within the semiconductor substrate 100, surrounding the head portion 60a of the P-shape gate 60. Contacts 76 are positioned above the source region 70 and are in contact with the source region 70. A drain region 80 is disposed within the semiconductor substrate, surrounded by the head portion 60a of the P-shape gate 60. The diffusion region of the drain region 80 is substantially smaller compared to the diffusion region of the source region 70. A contact 86 is positioned above the drain region 80 and in contact with the drain region 80.

Figure 3:
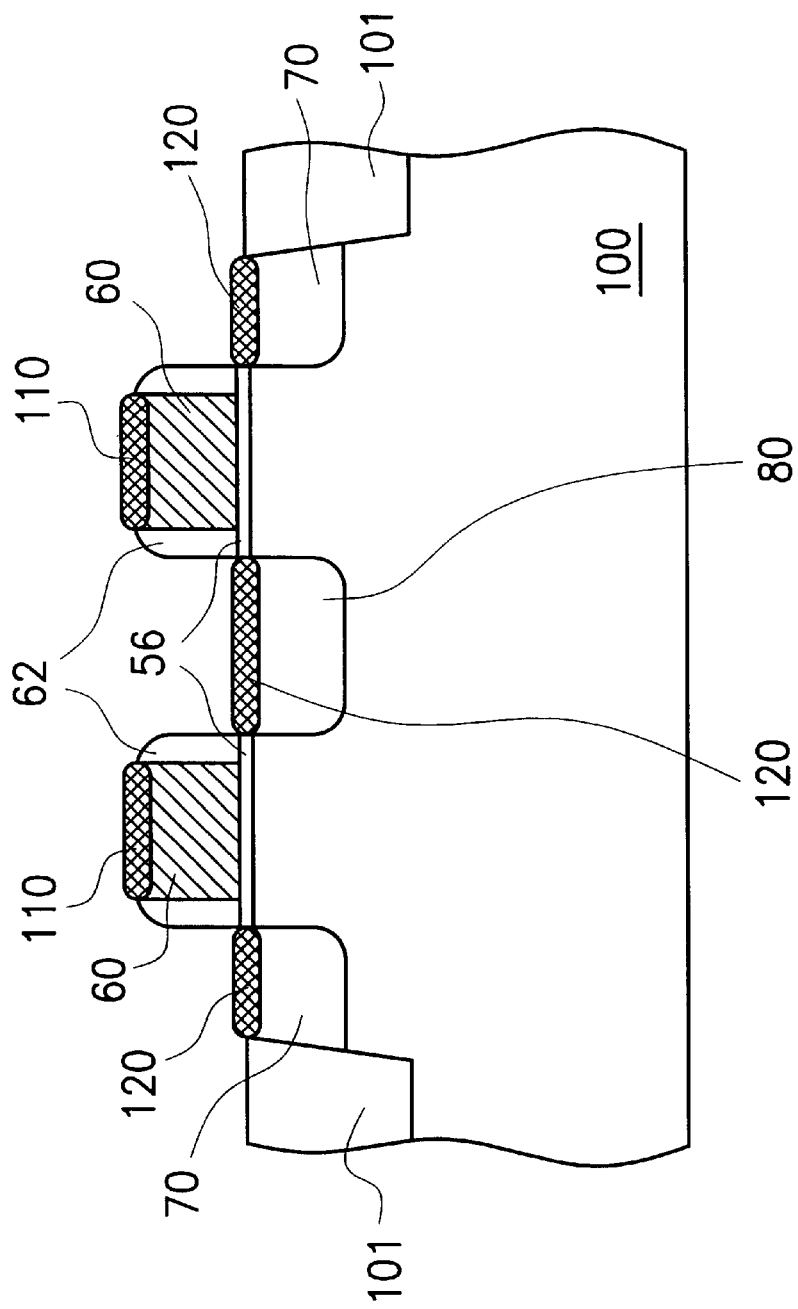
FIG. 3 shows a schematic cross sectional view of the MOSFET structure in FIG. 2 along line I—I.

FIG. 3 depicts a schematic cross sectional view of the MOSFET structure in FIG. 2 along line I-I according to a preferred embodiment of the present invention, showing the gate 60 disposed over a gate dielectric layer 56, spacers 62 being disposed on the sidewall of the gate 60, a source region 70 and a smaller drain region 80, and a shallow trench isolation structure 101 disposed on either side the MOSFET structure 30. Typically, the source/drain regions 70 and 80 implantations are made in the well known manner using implantations of boron fluoride, arsenic or phosphorus ions with a dose of between about $1 \times 10^{14}$ ions/cm$^2$ to about $1 \times 10^{16}$ ions/cm$^2$ at an energy level of between about 5 to 80 KeV. The source/drain regions 70 and 80 are then activated by heating the device to a temperature of between about 800° C. to 1100° C. for between 10 seconds.

By designing a P-shape gate structure, further size reduction of the MOSFET structure can be realized. A dash line 26 shown in the gate 60 represents the width of a channel under the gate 60, while a distance between the source/drain regions 70 and 80 is known as the channel length (not indicated). The channel width of the present invention (as shown in FIG. 2) can be longer than that of the conventional MOSFET structure. It is a well known design rule that a size reduction of cells would increase the device integration. Further, a decrease in the area of the source/drain would decrease the junction capacitance, therefore the performance of the device can be improved.

According to a preferred embodiment of the present invention, the Applicants further proposed disposing metal-silicide structures 110, 120 over the gate 60 and the source/drain regions 70 and 80, respectively, as illustrated in FIG. 3. Thus, the sheet resistance of the gate 60, and source/drain regions 70 and 80 can be effectively adjusted by choosing different thickness and materials for the metal silicide structures for meeting a specific device functionality requirement. In other words, the metal silicide structures 110, 120 would facilitate optimization of the device performance. In one preferred embodiment, the silicide structures 110, 120 on the gate 60 and the source/drain regions 70 and 80 may comprise of substantially same material. In another preferred embodiment, the silicide structures 110 and 120 on the gate 60 and the source/drain regions 70 and 80 may comprise of substantially different material.

As is known in the art, the acceptable metal silicide layers 110 and 120 can be formed using a number of different base metals, including titanium, cobalt, nickel, platinum and palladium. At the present time, titanium silicide is most widely implemented, but both cobalt silicide and nickel silicide are believed to have desirable characteristics for device with reduced line width. Accordingly, while the following description is made in terms of titanium silicide, other metal silicides can also be utilized in this process, as is known in the art. A treatment with dilute hydrofluoric acid (HF) solution may be performed to remove native oxides from the surface of the substrate. A thin metal layer is deposited over the device using a physical vapor deposition (e.g. sputtering). The thickness of the metal to be deposited is determined by balancing the need to deposit sufficient titanium to form a uniform and a desirably conductive titanium silicide layer against the need to leave sufficient silicon below the silicided structures. The excessive consumption of silicon in the substrate 100 during silicidation can lead to unexceptable junction leakage from the source/drain regions 70 and 80. Titanium silicide could be formed by performing a rapid thermal anneal (RTA) at a temperature of about 750° C. for about twenty seconds. A subsequent etch would remove the unreacted titanium. Titanium nitride, titanium-rich titanium silicide, titanium oxide and unreacted titanium are then etched from the surface of the device in a solution of $NH_4OH$, $H_2O_2$ and $H_2O$ (for example, at a ratio of 1:1:5), leaving titanium silicide layers over the gate 60 and the source/drain regions 70 and 80. Then another RTA at a temperature within a range of about 700° C. to 900° C. for between about 10 to 60 seconds is carried out to convert the above silicide structures to a lower resistivity phase. Most preferably, the latter RTA is performed at a temperature of about 850° C. for about 20 seconds.

Accordingly, the present inventors provide a smaller size MOSFET structure having reduced parasitic junction capacitance so that a MOSFET structure having high operating frequencies, smaller, and more densely packed integrated circuit device can be realized.

It is to be understood that by designing a P-shape gate structure 60, a source region 70 surrounding a drain region 80 can be formed, therefore the area of the drain region 80 can be smaller compared to the conventional MOSFET structure. In other words, asymmetric source/drain regions with smaller areas can be formed. This makes it possible to further reduce the junction capacitance. And the size of the MOSFET device can be reduced thereby increasing the integration of the IC device.

It is to be understood that because of the smaller source/drain regions 70 and 80, less contacts 76 and 86 are required compared to the conventional MOSFET 18. Consequently, the area needed for a conductive layer to electrically connect with the contacts over the MOSFET 30 can be smaller compared to the conventional MOSFET structure 18. Thus the integration of the semiconductor device 30 can be increased.

It is to be understood that because of the P-shape gate, the channel width can be effectively increased. Because the channel width is increased, the channel current can be larger. Thus the performance of the semiconductor device 30 can be substantially enhanced.

The method of the present invention is simple. The layers, the photolithography and etching, ion implantations techniques, etc., are well known semiconductor manufacturing processes. Therefore, application of the method of the present invention for manufacturing semiconductor device is not complex and is readily viable.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A semiconductor device comprising:
   a substrate;
   a hollow closed type gate structure disposed over the substrate, wherein the hollow closed type gate structure comprises a hollow head portion and a tail portion connected to the head portion;
   a space enclosed within the hollow head portion of the hollow closed type gate structure;
   a drain region disposed within the substrate in the space of the hollow closed type gate structure;
   a source region disposed within the substrate, the source region surrounding the hollow closed type gate structure; and
   a gate dielectric layer disposed between the hollow closed type gate structure and the substrate.

2. The semiconductor device of claim 1, wherein the area of the drain region is smaller than the area of the source region.

3. The semiconductor device of claim 1, wherein the hollow head portion comprises a shape of a hollow square.

4. The semiconductor device of claim 1, wherein the hollow head portion comprises a shape of a hollow rectangle.

5. The semiconductor device of claim 1, wherein the hollow head portion comprises a shape of a hollow circle.

6. The semiconductor device of claim 1, wherein the hollow head portion comprises a shape of a hollow hexagon.

7. The semiconductor device of claim 1, wherein the hollow head portion comprises a shape of a hollow octagon.

8. The semiconductor device of claim 1, wherein the material of the hollow closed type gate structure line comprises doped polysilicon.

9. The semiconductor device of claim 1, wherein further comprising a metal silicide layer disposed on the hollow closed type gate structure and the source/drain regions.

10. A semiconductor device comprising:
    a substrate;
    a p-shape gate disposed on the substrate, wherein the p-shaped gate comprises a hollow head portion enclosing a space, and a tail portion;
    a drain region disposed within the substrate in the hollow head portion of the p-shaped gate;
    a source region disposed within the substrate, the source region surrounding the p-shape gate; and
    a gate dielectric layer disposed between the p-shape gate and the substrate.

11. The semiconductor device of claim 10, wherein the area of the drain region is smaller than the area of the source region.

12. The semiconductor device of claim 10, wherein the hollow head portion comprises a shape of a hollow square.

13. The semiconductor device of claim 10, wherein the hollow head portion comprises a shape of a hollow rectangle.

14. The semiconductor device of claim 10, wherein the hollow head portion comprises a shape of a hollow circle.

15. The semiconductor device of claim 10, wherein the hollow head portion comprises a shape of a hollow hexagon.

16. The semiconductor device of claim 10, wherein the hollow head portion comprises a shape of a hollow octagon.

17. The semiconductor device of claim 10, wherein the material of the p-shape gate comprises doped polysilicon.

18. The semiconductor device of claim 10, wherein further comprising a metal silicide layer disposed on the p-shape gate and the source/drain region.

19. The semiconductor device of claim wherein the material of the metal-silicide layer is selected from one of the group consisting titanium silicide, cobalt silicide, nickel silicide, and palladium silicide.

* * * * *